United States Patent [19]
Ueno

[11] Patent Number: 5,614,749
[45] Date of Patent: Mar. 25, 1997

[54] SILICON CARBIDE TRENCH MOSFET

[75] Inventor: Katsunori Ueno, Nagano, Japan

[73] Assignee: Fuji Electric Co., Ltd.

[21] Appl. No.: 591,796

[22] Filed: Jan. 25, 1996

[30] Foreign Application Priority Data

Jan. 26, 1995 [JP] Japan ................. 7-010272

[51] Int. Cl.$^6$ ............ H01L 29/78; H01L 29/47; H01L 29/12; H01L 29/06
[52] U.S. Cl. ............ 257/330; 257/77; 257/289; 257/356; 257/473
[58] Field of Search ............ 257/330–332, 257/334, 289, 77, 356, 472, 473

[56] References Cited

U.S. PATENT DOCUMENTS

| | | | |
|---|---|---|---|
| 5,216,264 | 6/1993 | Fujii et al. | 257/289 |
| 5,323,040 | 6/1994 | Baliga | 257/332 |
| 5,396,085 | 3/1995 | Baliga | 257/77 |
| 5,506,421 | 4/1996 | Palmour | 257/77 |

OTHER PUBLICATIONS

"Trench DMOS Transistor Technology For High–Current (100 A Range) Switching" by Constantin Bulucea and Rebecca Rossen, Solid State Electronics, vol. 34, No. 5 pp. 493–507, 1991.

"High Power and High Frequency Silicon Carbide Devices" by Palmour et al., as published in Diamond SiC, and Nitride Wide–Bandgap Semiconductors Materials Research Society Proceedings, 1994, Presented at the 1994 MRS Spring Meeting, Apr. 5, 1994.

*Primary Examiner*—Gene M. Munson
*Attorney, Agent, or Firm*—Rossi & Associates

[57] ABSTRACT

A silicon carbide trench MOSFET is provided that includes a first conductivity type semiconductor substrate made of silicon carbide. A first conductivity type drift layer and a second conductivity type base layer, both made of silicon carbide, are sequentially formed by epitaxial growth on the semiconductor substrate. The first conductivity type drift layer has a lower impurity concentration than the semiconductor substrate. A first conductivity type source region is formed in a part of a surface layer of the second conductivity type base layer. A gate electrode is received through an insulating film, in a first trench extending from a surface of the first conductivity type source region to reach the first conductivity type drift layer. A Shottky electrode disposed on an inner surface of a second trench having a greater depth than the first trench.

4 Claims, 3 Drawing Sheets

SILICON CARBIDE TRENCH MOSFET

FIELD OF THE INVENTION

The present invention relates to a vertical silicon carbide MOSFET (field-effect transistor) having high withstand voltage, which can be used under severe or harsh conditions, such as in high temperatures or when radioactive rays are present.

BACKGROUND OF THE INVENTION

Silicon carbide (hereinafter abbreviated as SiC) is a chemically stable material having a large band gap, and has been studied and highly expected to be a more favorable material for various semiconductor devices which can be used at a high temperature or when subjected to radioactive rays, as compared with silicon. While the conventional silicon devices have an operation limit of up to about 150° C., it has been confirmed that a prototype of an element or device formed of SiC, such as a pn junction diode or a MOSFET (field-effect transistor of a metal-oxide-semiconductor structure), can be operated at 400° C. or higher. If the use of the SiC device at a high temperature is feasible, a robot or a computer including SiC devices can be used under severe, inaccessible environments, for example, in a nuclear reactor or in space.

In addition, the conventional silicon device requires cooling equipment for avoiding a temperature rise due to heat caused by a generator loss during operation of the device. This makes the whole semiconductor device large-sized due to the presence of a cooling fin or other cooling equipment. If SiC is employed to form the semiconductor device, such cooling equipment can be significantly small-sized and simplified. The thus small-sized semiconductor devices may provide many components of an automobile, for example, assuring significantly reduced fuel consumption, which has a great effect on environmental conservation. Thus, the semiconductor devices formed of SiC have been highly expected to yield advantageous effects when used in many applications.

A vertical MOSFET is considered as an important or advantageous type of device when making an attempt to use SiC in a power semiconductor device, since the vertical MOSFET, which is a voltage-driven device, allows parallel driving of a plurality of elements and simplification of a drive circuit. Further, the vertical MOSFET is a unipolar element, and thus enables high-speed switching. While it is difficult to diffuse impurities into SiC, unlike silicon, it is relatively easy to utilize epitaxial growth to produce the SiC device. Therefore, it is generally known to provide a trench MOSFET having a trench 5 as shown in FIG. 4. FIG. 4 is a cross sectional view showing a principal part of the trench MOSFET formed of SiC, which has been developed up to the present. In the figure, an n drift layer 2 having a lower impurity concentration than an $n^+$ substrate 1, and a p-type p base layer 3 are epitaxially grown on the $n^+$ substrate 1 to provide a SiC substrate, and a $n^+$ source region 4 having a high impurity concentration is formed in a selected area of a surface layer of the SiC substrate. A trench 5 is formed in a part of the $n^+$ source region 4, to extend from the surface of the source region 4 down to the n drift layer 2. The device further includes a gate electrode 7 which is disposed inside the trench 5, through a gate insulating film 6. Further, a source electrode 8 is formed in contact with both the surface of the $n^+$ source region 4 and an exposed portion of the surface of the p base layer 3, and a drain electrode 9 is formed on the rear surface of the $n^+$ substrate 1.

In operation of the MOSFET constructed as described above, when a positive voltage of not lower than a predetermined level is given to the gate electrode 7, while a voltage is applied between the drain electrode 9 and the source electrode 8, an inversion layer appears in the surface layer of the p base layer 3 adjacent to the gate electrode 7, and electrons flow from the source electrode 8 toward the drain electrode 9 through the inversion layer. The gate insulating film 6 used in this SiC device may be a silicon oxide film formed through thermal oxidation of SiC.

Where the electric field in the insulating film and that in the semiconductor are respectively represented by Ei and Es, and the dielectric constant of the insulating film and that of the semiconductor are respectively represented by $\epsilon i$ and $\epsilon s$, the relationship indicated by the following equation: $\epsilon i \cdot Ei = \epsilon s \cdot Es$ is established at the interface between the insulating film and the semiconductor. Accordingly, the following equation: $Ei/Es = \epsilon s/\epsilon i$ is established. This value Ei/Es will be calculated in both cases where the semiconductor is formed of silicon and SiC, respectively, and the insulating film is a silicon oxide film having a dielectric constant $\epsilon i$ of 3.8. In the case of silicon having a dielectric constant $\epsilon s$ of 11.7, the value Ei/Es is equal to 3.1. In the case of SiC having a dielectric constant $\epsilon s$ of 10.0, the value Ei/Es is equal to 2.6. Namely, the electric field applied to the gate insulating film of the conventional device of FIG. 4 is far greater than that applied to semiconductor parts of the same device. FIG. 5 is a graph indicating the distribution of the electric field in a gate portion of the device, along line A—A of FIG. 4. In the graph of FIG. 5, the axis of ordinates indicates the strength of the electric field, and the axis of abscissas indicates the depth. It will be understood from this graph that the strength of the electric field Ei of the insulating film is about three times as high as that of the semiconductor Es.

Further, the maximum electric field Esmax in the semiconductor is equal to $2 \times 10^5$ V/cm in the case of silicon, and is equal to $2 \times 10^6$ V/cm in the case of SiC. Accordingly, the maximum electric field in the insulating film Eimax is equal to $6 \times 10^5$ V/cm in the case of silicon, and is equal to $5 \times 10^6$ V/cm in the case of SiC. Assuming that the dielectric breakdown voltage of the silicon oxide film is about $8 \times 10^6$ V/cm, a large electric field that is close to the breakdown voltage is applied to the gate insulating film when the avalanche breakdown starts within the semiconductor formed of SiC.

A power device is normally required to withstand a predetermined current when avalanche current flows through the device. In the conventional SiC trench MOSFET, however, the avalanche breakdown starts at the trench of the gate portion of the device, and the amount of resistance to the avalanche is limited to a considerably small value, due to the dielectric breakdown of the gate insulating film.

In the light of the above problems, it is an object of the present invention to provide a SiC trench MOSFET which is free from dielectric breakdown of a gate insulating film, and provides a large amount of resistance to avalanche breakdown.

SUMMARY OF THE INVENTION

The above object may be accomplished according to a first aspect of the present invention, which provides a silicon carbide trench MOSFET comprising: a first conductivity type semiconductor substrate made of silicon carbide; a first conductivity type drift layer and a second conductivity type base layer both made of silicon carbide and sequentially formed on the semiconductor substrate by epitaxial growth, the first conductivity type drift layer having a lower impurity concentration than the semiconductor substrate; a first conductivity type source region formed in a part of a surface layer of the second conductivity type base layer; an electrode to which voltage is applied, the electrode being received in a first trench through an insulating film, the first trench extending from a surface of the first conductivity type source region to reach the first conductivity type drift layer; and a Shottky electrode disposed on an inner surface of a second trench which is deeper than the first trench.

The above object may also be accomplished according to a second aspect of the invention, which provides a silicon carbide trench MOSFET comprising: a first conductivity type semiconductor substrate made of silicon carbide; a first conductivity type drift layer, a second conductivity type base layer and a first conductivity type source layer each made of silicon carbide and sequentially formed on the semiconductor substrate by epitaxial growth, the first conductivity type drift layer having a lower impurity concentration than the semiconductor substrate; an electrode to which voltage is applied, the electrode being received in a first trench through an insulating film, the first trench extending from a surface of the first conductivity type source layer to reach the first conductivity type drift layer; and a Shottky electrode disposed on an inner surface of a second trench which is deeper than the first trench.

In the silicon carbide trench MOSFET constructed as described above, the Shottky electrode is disposed in contact with the inner surface of the second trench which is deeper than the trench filled with the gate electrode. In this arrangement, the maximum electric field occurs at a portion of the device which is spaced apart from the trench having the gate insulating film. This consequently prevents the dielectric breakdown of the insulating film, and increases the amount of resistance to the avalanche breakdown.

In particular, the Shottky electrode disposed in contact with the second trench may be formed of a metal selected from the group consisting of Ti, Au, Pt, and Al-Ti alloy.

DETAILED DESCRIPTION OF THE PREFERRED EMBODIMENTS

Figure 1:
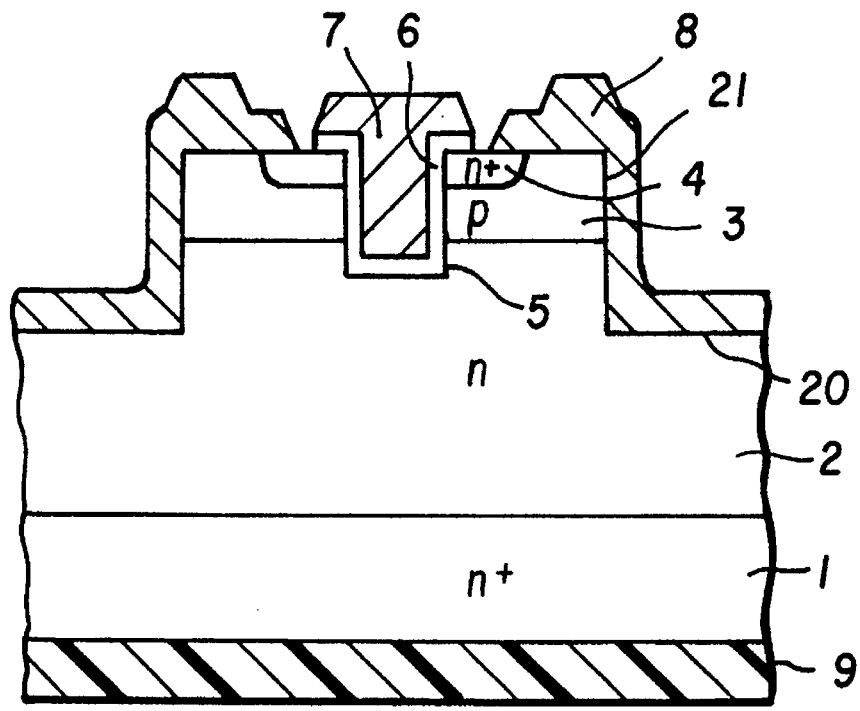
FIG. 1 is a cross sectional view showing a principal part of a SiC trench MOSFET according to one embodiment of the present invention.
Figure 4:
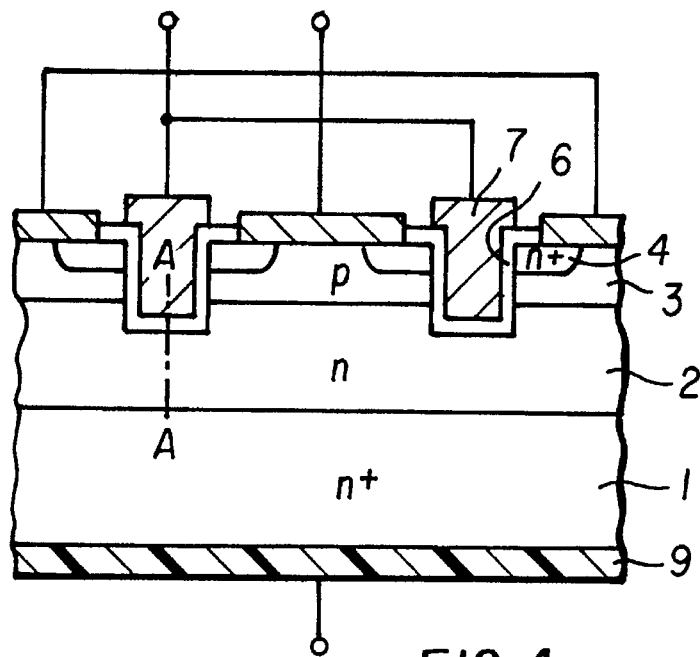
FIG. 4 is a cross sectional view showing a principal part of a conventional SiC trench MOSFET.
Figure 5:
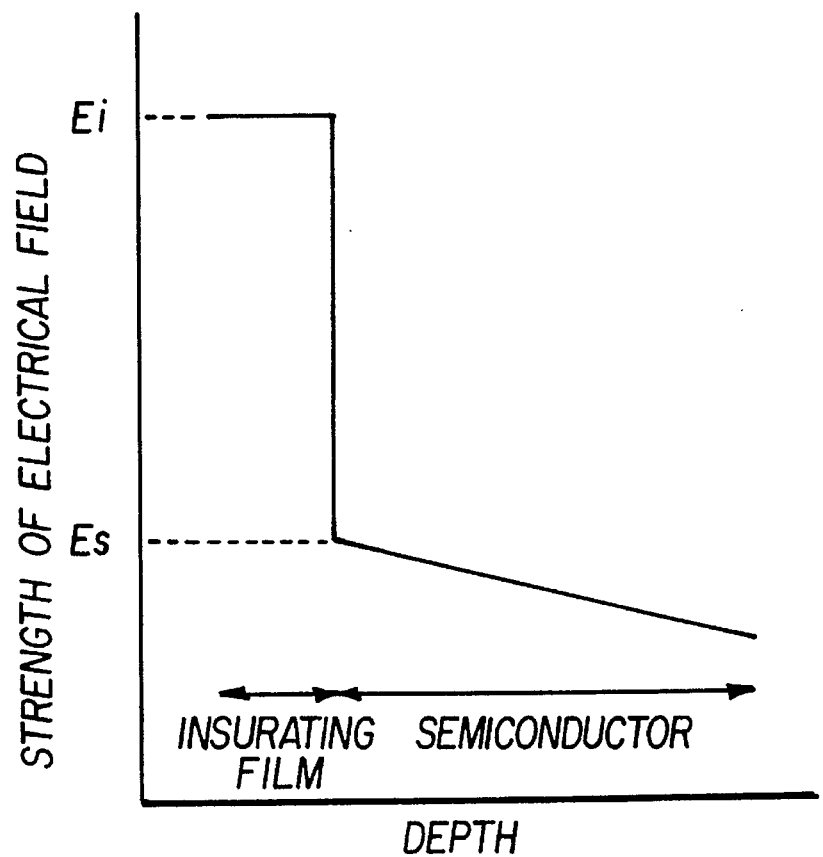
FIG. 5 is a graph showing the distribution of the electrical field strength along line A—A of the trench MOSFET of FIG. 4.

Referring first to FIG. 1, there is shown in cross section a principal part of a SiC trench MOSFET constructed according to one embodiment of the present invention. While this figure only shows an active region of the semiconductor device assigned to perform switching of electric current, the device further includes a peripheral portion mainly contributing to withstanding voltage. This voltage-withstanding portion is not shown in the figure nor described in detail since it is not related to the principle of the present invention. In FIG. 1, an n drift layer 2 containing a relatively low concentration of impurities and a p-type p base layer 3 are epitaxially grown on an $n^+$ substrate 1, so as to form a SiC substrate. Further, a $n^+$ source region 4 having a relatively high impurity concentration is formed in a selected area of a surface layer of the p base layer 3 of the SiC substrate. A trench 5 is formed through a part of the $n^+$ source region 4, to extend from the surface of the $n^+$ source region 4 to reach the n drift layer 2. A gate electrode 7 formed of polycrystalline silicon is disposed inside the trench 5, through a gate insulating film 6 in the form of a silicon oxide film. This device further includes a drain electrode 9 formed from a Ni film, which is disposed on the rear surface of the $n^+$ substrate 1. Although the MOSFET of the present embodiment is identical with the conventional MOSFET of FIG. 4 in the above respects, the present MOSFET is further formed with a second trench 20 having a greater depth than the trench 5 receiving the gate electrode 7, such that the second trench 20 extends from the surface of the p base layer 3 into the n drift layer 2. Further, a Shottky electrode 21 formed of Ti is disposed to extend from the bottom surface of the second trench 20 onto the surface of the p base layer 3. A source electrode 8 formed from a Ni film is also disposed in contact with the $n^+$ source region 4 and the Shottky electrode 21.

In operation of the MOSFET of FIG. 1, when a positive voltage of not lower than a predetermined level is given to the gate electrode 7 while voltage is applied between the drain electrode 9 and the source electrode 8, an inversion layer appears in the surface layer of the p base layer 3 adjacent to the gate electrode 7, and electrons flow from the source electrode 8 toward the drain electrode 9 through the inversion layer.

Since the depth of the second trench 20 of the MOSFET shown in FIG. 1 is greater than that of the trench 5 formed in the gate portion of the device which includes the gate electrode 7, avalanche breakdown is likely to occur in the first place at corners of the second trench 20 when the voltage applied between the drain electrode 9 and the source electrode 8 is increased. Accordingly, the gate insulating film 6 will not be broken due to avalanche breakdown which might otherwise occur at corners of the trench 5 of the gate portion. Namely, the MOSFET of the present embodiment does not suffer from dielectric breakdown of the gate insulating film upon application of voltage to the device, thus assuring a large amount of resistance to the avalanche breakdown.

Figure 3A:
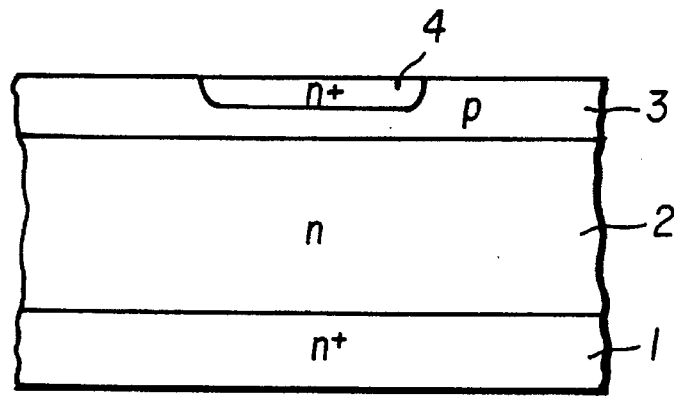
FIG. 3(a) through FIG. 3(d) are cross sectional views showing process steps for manufacturing the SiC trench MOSFET of FIG. 1.
Figure 3B:
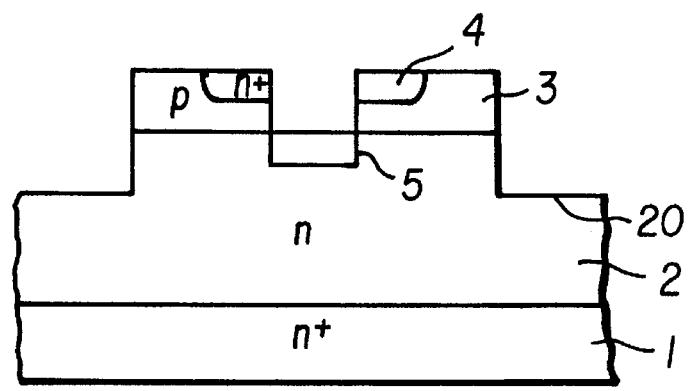
Figure 3C:
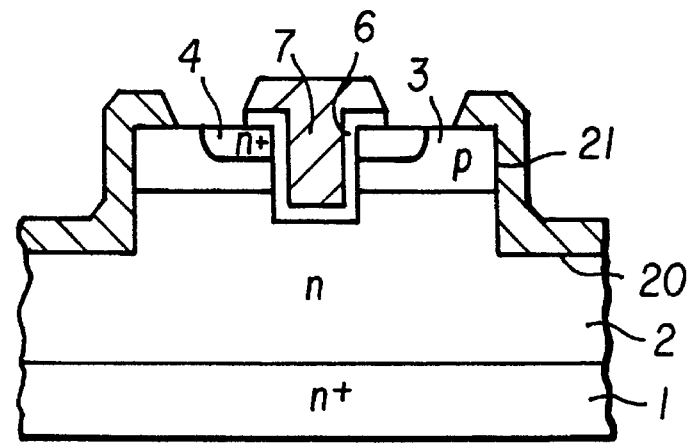
Figure 3D:
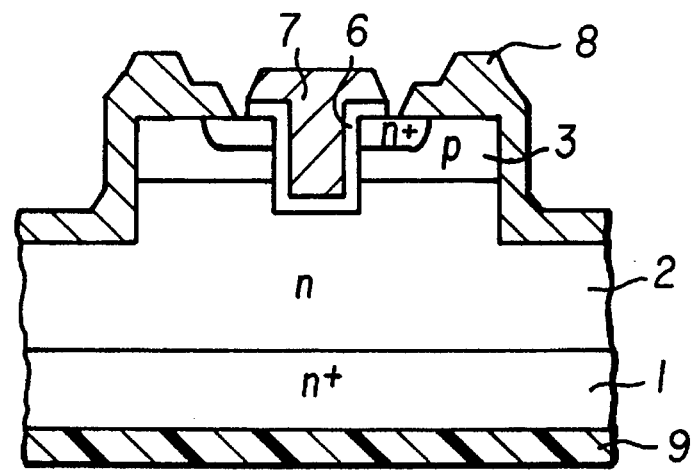

FIG. 3(a) through 3(d) are cross sectional views showing process steps for manufacturing the MOSFET of the embodiment of FIG. 1. Initially, the n drift layer 2 having a lower impurity concentration than the $n^+$ substrate 1 and the p-type p base layer 3 are epitaxially grown on the $n^+$ substrate 1, to thus provide a SiC substrate. This SiC substrate is then subjected to ion implantation, such that nitrogen ions are implanted with high density in a selected area of the surface layer of the p base layer 3, which area is then activated by heat treatment, so as to form the $n^+$ source region 4, as shown in FIG. 3(a). In the next step shown in FIG. 3(b), the trench 5 is formed in the gate portion of the semiconductor device, by patterning with photo resist, and the second trench 20 is formed in such a region where the avalanche is likely to occur, by plasma etching using a mixed gas of chlorine and oxygen. The formation of the trenches 5, 20 may also be accomplished by selective oxidization. In this step, it is important to control the depth of the second trench 20 in the above-indicated region to be greater than the depth of the trench 5 formed in the gate portion. In the next step, the gate insulating film 6 is formed in the trench 5 by thermal oxidation, and the trench 5 is filled with polycrystalline silicon by a CVD method under reduced pressure, to thus form the gate electrode 7. Subsequently, titanium (Ti) is deposited by sputtering on the second trench 20 in the region of occurrence of the avalanche, and the Ti film thus formed is then patterned with photo resist into the Shottky electrode 21, as shown in FIG. 3(c). Finally, nickel (Ni) is deposited by sputtering to form the source electrode 8 and the drain electrode 9, as shown in FIG. 3(d).

The Shottky electrode 21 may also be formed of Au, Pd, or an alloy of Al and Ti. In any case, the Shottky electrode 21 can be formed at a low temperature. A prototype of a Shottky diode having high withstand voltage has been built, which may use SiC to achieve a Shottky junction of high withstand voltage.

It will be understood from the above description that there is no particular problem in the process of manufacturing the SiC trench MOSFET of the present invention.

Figure 2:
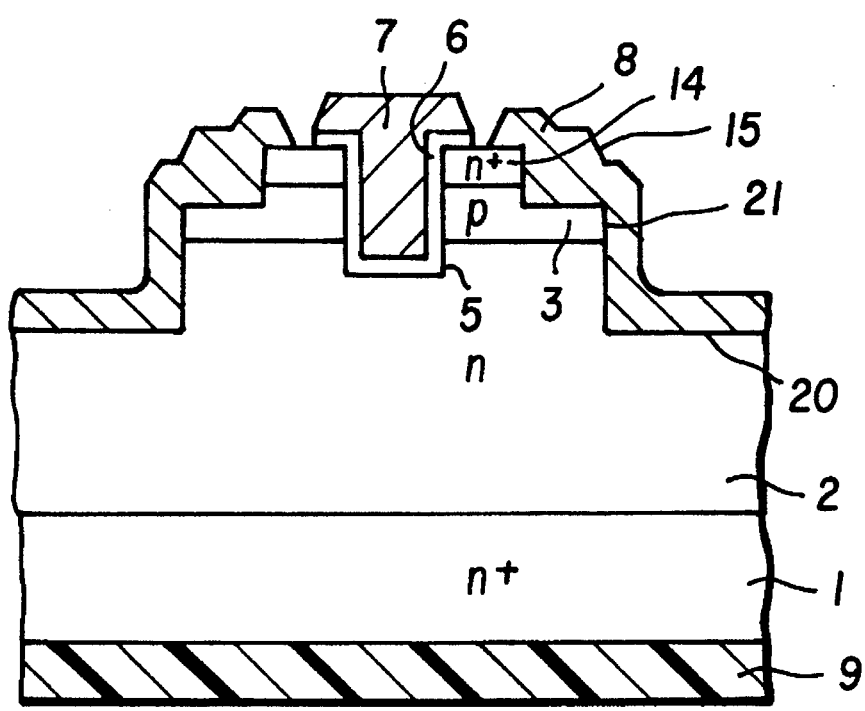
FIG. 2 is a cross sectional view showing a principal part of a SiC trench MOSFET according to another embodiment of the present invention.

Referring next to FIG. 2, there is shown in cross section a principle part of a SiC trench MOSFET constructed according to another embodiment of the present invention. In this figure, an n drift layer 2 having a lower concentration of impurities than an $n^+$ substrate 1, a p-type p base layer 3, and an $n^+$ source layer 14 having a high impurity concentration are epitaxially grown on the $n^+$ substrate 1, to thus form a SiC substrate. A trench 5 and a second trench 20 having a greater depth than the trench 5 are then formed to extend from the surface of the SiC substrate into the n drift layer 2. A gate electrode 7 formed of polycrystalline silicon is disposed inside the trench 5, through a gate insulating film 6 in the form of a silicon oxide film. Further, a drain electrode 9 is formed on the rear surface of the substrate 1. The MOSFET thus constructed is similar to the MOSFET of the first embodiment of FIG. 1 in the above respects. In the MOSFET of the second embodiment, however, a part of the $n^+$ source layer 14, which has been epitaxially grown on the substrate 1, is removed by etching, to thereby form a step 15 to which the surface of the p base layer 3 is exposed, and a Shottky electrode 21 formed of Ti is disposed so as to extend from the bottom of the second trench 20 onto the exposed surface of the p base layer 3. Further, a source electrode 8 in the form of a Ni film is disposed in contact with both the surface of the $n^+$ source layer 14 and the Shottky electrode 21, and a drain electrode 9 is formed on the rear surface of the $n^+$ substrate 1.

Since the depth of the second trench 20 is greater than that of the trench 4 in the gate portion in the MOSFET of FIG. 2, as in the first embodiment, the avalanche breakdown occurs in the first place at corners of the second trench 20, thus preventing the gate insulating film 6 from being broken. Namely, the MOSFET of the present embodiment does not suffer from dielectric breakdown of the gate insulating film upon application of voltage to the device, thus assuring a large amount of resistance to the avalanche breakdown.

As described above, the SiC vertical MOSFET of the present invention is constructed such that the Shottky electrode formed of Ti, for example, is formed in the second trench that is deeper than the trench in the gate portion. Therefore, the SiC trench MOSFET thus constructed is free from dielectric breakdown of the gate insulating film when voltage is applied to the device, and assures an increased amount of resistance to the avalanche breakdown.

What is claimed is:

1. A silicon carbide trench MOSFET comprising:

a first conductivity type semiconductor substrate comprising silicon carbide;

a first conductivity type drift layer and a second conductivity type base layer both comprising silicon carbide and sequentially formed by epitaxial growth on said semiconductor substrate, said first conductivity type drift layer having a lower impurity concentration than the semiconductor substrate;

a first conductivity type source region formed in a part of a surface layer of said second conductivity type base layer;

a first trench extending from a surface of said first conductivity type source region to reach said first conductivity type drift layer, a gate electrode formed in said first trench; an insulating film located between said gate electrode and said first conductivity type source region, said second conductivity type base layer and said first conductivity type drift layer; and a Shottky electrode disposed on an inner surface of a second trench having a greater depth than said first trench.

2. A silicon carbide trench MOSFET as defined in claim 1, wherein said Shottky electrode is formed of a metal selected from the group consisting of Ti, Au, Pt, and Al-Ti alloy.

3. A silicon carbide trench MOSFET comprising:

a first conductivity type semiconductor substrate comprising silicon carbide;

a first conductivity type drift layer, a second conductivity type base layer and a first conductivity type source layer each comprising silicon carbide and sequentially formed by epitaxial growth on said semiconductor substrate, said first conductivity type drift layer having a lower impurity concentration than the semiconductor substrate;

a first trench extending from a surface of said first conductivity type source layer to reach said first conductivity type drift layer;

a gate electrode formed in said first trench; and a Shottky electrode disposed on an inner surface of a second trench having a greater depth than said first trench.

4. A silicon carbide trench MOSFET as defined in claim 3, wherein said Shottky electrode is formed of a metal selected from the group consisting of Ti, Au, Pt, and Al-Ti alloy.

* * * * *